(12) United States Patent
Sakiyama et al.

(10) Patent No.: US 7,453,313 B2
(45) Date of Patent: Nov. 18, 2008

(54) CHARGE PUMPING CIRCUIT

(75) Inventors: Shiro Sakiyama, Osaka (JP); Yusuke Tokunaga, Osaka (JP); Shiro Dosho, Osaka (JP); Toru Iwata, Osaka (JP); Takashi Hirata, Osaka (JP)

(73) Assignee: Panasonic Corporation, Osaka (JP)

( * ) Notice: Subject to any disclaimer, the term of this patent is extended or adjusted under 35 U.S.C. 154(b) by 55 days.

(21) Appl. No.: 11/637,687

(22) Filed: Dec. 13, 2006

(65) Prior Publication Data

US 2007/0183175 A1 Aug. 9, 2007

(30) Foreign Application Priority Data

Jan. 30, 2006 (JP) .............................. 2006-020991

(51) Int. Cl.
*G06F 3/02* (2006.01)
(52) U.S. Cl. ........................................ 327/536; 327/157
(58) Field of Classification Search ...................... None
See application file for complete search history.

(56) References Cited

U.S. PATENT DOCUMENTS

| | | | |
|---|---|---|---|
| 5,727,037 A | 3/1998 | Maneatis | |
| 5,831,484 A * | 11/1998 | Lukes et al. | ................ 331/17 |
| 6,130,565 A * | 10/2000 | Nagano et al. | ............ 327/157 |
| 6,339,350 B1 * | 1/2002 | Tanaka | ...................... 327/148 |
| 6,472,914 B1 * | 10/2002 | Gu et al. | .................... 327/157 |
| 6,747,506 B1 | 6/2004 | Thiara | |
| 6,873,214 B2 * | 3/2005 | Harwood | ..................... 331/17 |
| 6,928,128 B1 * | 8/2005 | Sidiropoulos | ............... 375/376 |
| 7,339,438 B2 * | 3/2008 | Sohn | ........................... 331/17 |
| 2001/0052811 A1 * | 12/2001 | Kim | ........................... 327/536 |
| 2005/0237120 A1 * | 10/2005 | Park | ............................ 331/16 |

FOREIGN PATENT DOCUMENTS

JP 2000-82954 3/2000

* cited by examiner

*Primary Examiner*—Cassandra Cox
(74) *Attorney, Agent, or Firm*—McDermott Will & Emery LLP (57) ABSTRACT

A charge pumping circuit includes a first switch for controlling one of push and pull operations in accordance with a first control signal; a current mirror circuit constructed from transistors each having a different polarity from the first switch; a second switch for controlling current input to the current mirror circuit in accordance with a second control signal, the second switch being constructed from a transistor having the same characteristic as a transistor used for constructing the first switch; a first MOS capacitor one end of which is connected to an input side of the current mirror circuit; a second MOS capacitor receiving, at one end thereof, a current concerned with the push and pull operations; and a voltage buffer connected to the first and second MOS capacitors. The other of the push and pull operations is performed with an output current of the current mirror circuit.

4 Claims, 4 Drawing Sheets

CHARGE PUMPING CIRCUIT

CROSS-REFERENCE TO RELATED APPLICATIONS

This application claims priority under 35 U.S.C. §119 on patent application Ser. No. 2006-20991 filed in Japan on Jan. 30, 2006, the entire contents of which are hereby incorporated by reference.

BACKGROUND OF THE INVENTION

The present invention relates to a charge pumping circuit, and more particularly, it relates to a charge pumping circuit suitably used in a feedback system such as a PLL (phase locked loop) or a DLL (delay locked loop).

Figure 6:
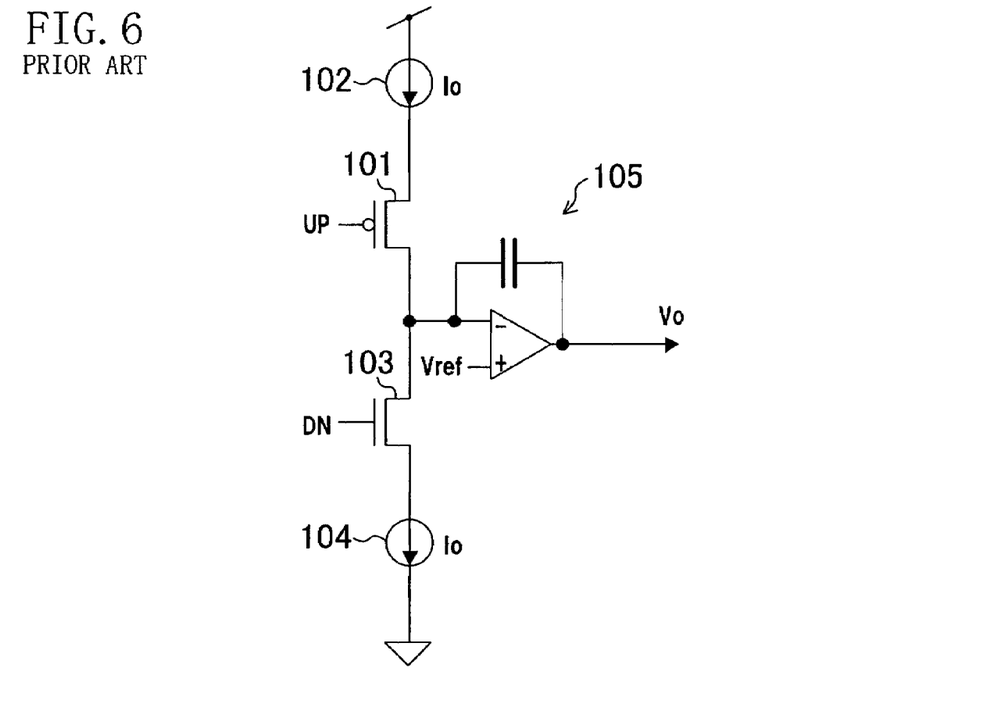
FIG. 6 is a diagram for showing the configuration of a conventional charge pumping circuit.

In general, a charge pumping circuit is used for generating a signal for controlling a voltage control oscillator (VCO) or a voltage control delay circuit (VCD) in a feedback system such as a PLL or a DLL. FIG. 6 shows the configuration of a conventional charge pumping circuit. When a signal UP is activated, a switch 101 is turned on and a current is supplied from a current source 102, namely, what is called a push operation is performed. On the other hand, when a signal DN is activated, a switch 103 is turned on and a current is drawn by a current source 104, namely, what is called a pull operation is performed. Such a current concerned with the push/pull operation is subjected to filtering processing by a low-pass filter 105 so as to generate a voltage Vo. The voltage Vo is used as a control signal for the VCO or the VCD (see, for example, Japanese Laid-Open Patent Publication No. 2000-82954 (p. 6, FIG. 6)).

In the control of each switch in the charge pumping circuit, switching noise is caused in the current by the push/pull operation. This switching noise will now be described with reference to FIG. 7.

In, for example, a switch constructed from a pMOS transistor, before turning on the switch, a charge of output capacitance is discharged through the fringe capacitance or the like of the switch and moves to a gate side, namely, what is called feedthrough noise is caused. Furthermore, after turning on the switch, the charge of the output capacitance is discharged through the gate capacitance or the like of the switch and moves to the gate side, namely, what is called injection noise is caused (corresponding to a period A of FIG. 7). Therefore, an output current is not supplied to a load capacitor immediately as a specified current Io but is used for charging the fringe capacitance and the gate capacitance for a while, and a remaining charge is charged in the load capacitor (corresponding to a period B of FIG. 7). The output voltage value of a current source is changed with time due to the influence of the on resistance of the switch if the current source is not an ideal current source, and hence, a state where the specified current Io cannot be attained lasts (corresponding to a period C of FIG. 7).

Figure 7:
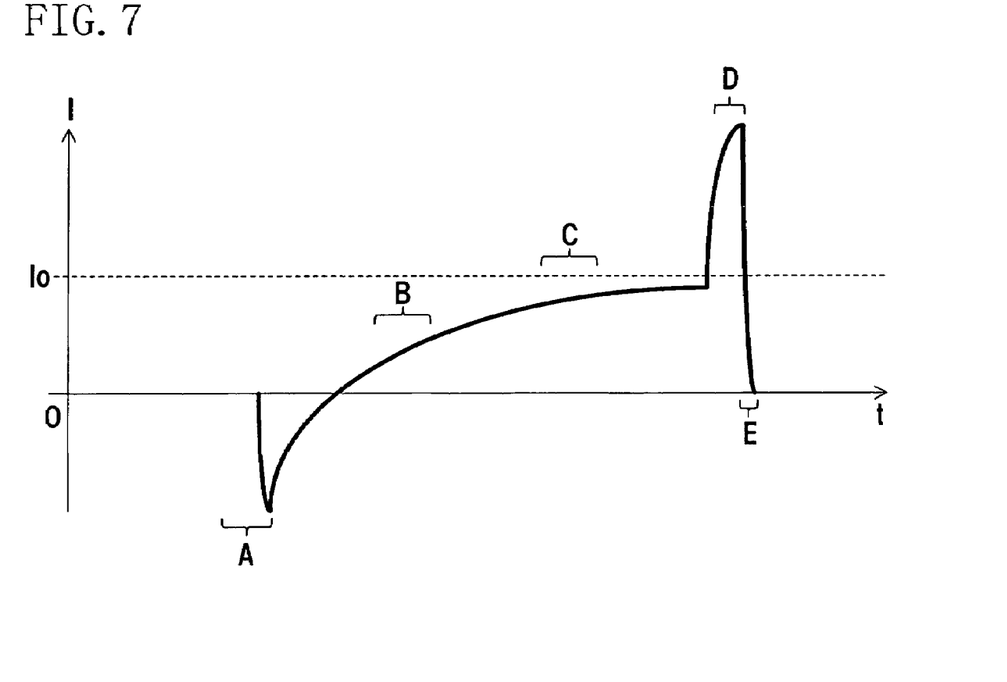
FIG. 7 is a graph of charged charge on which switching noise is superimposed.

Next, in the instant of turning off the switch, the charge stored in the fringe capacitance and the gate capacitance is output at a stroke (which corresponds to feedthrough noise and injection noise), and the output current exceeds the specified current Io for a short period of time (corresponding to a period D of FIG. 7). Thereafter, the feedthrough noise and the injection noise are converged and the value of the output current is converged to zero (corresponding to a period E of FIG. 7).

When the charge pumping circuit is operated at high speed, a charge error derived from the switching noise is considerably large as compared with the charge moving through the push/pull operation. For example, it is assumed that the current value of the current source is 5 μA and the charge pumping circuit is operated at 250 MHz. In this case, a charge supplied in one switching operation is 5 f coulomb (=5 μA×1 ns). On the other hand, assuming that the fringe capacitance of the switch is 1 fF and the switch is operated at 4 V, a charge derived from feedthrough noise is 4 f coulomb (=4 V×1 fF). In this case, the charge error derived from the noise is substantially the same as the charge supplied from the current source. In other words, the charge moving through the push/pull operation of the charge pumping circuit includes an error derived from noise.

The significant point is that a charge error derived from noise is different depending upon the polarity of a transistor. In particular, between an n-channel transistor and a p-channel transistor, the relationship between a control voltage for turning-on and turning-off and the threshold voltage of the transistor is different, and hence, the quantity of a charge derived from charge injection noise is largely different. Owing to the characteristics of transistors, it is actually impossible to suppress the occurrence of the feedthrough noise and the injection noise. Furthermore, since the injection noise is changed in accordance with a power supply and process variation, it is extremely difficult to equalize the switching noise between a p-channel transistor and an n-channel transistor. Accordingly, since switching noise is asymmetric depending upon the polarity of transistors in the conventional charge pumping circuit, it is actually impossible to secure balance or relationship of a given ratio between a charge charged through a push operation and a charge discharged through a pull operation.

SUMMARY OF THE INVENTION

In consideration of the aforementioned conventional disadvantages, an object of the invention is, in a charge pumping circuit, attaining balance or a given ratio between a charge charged through a push operation and a charge discharged through a pull operation.

In one aspect of the invention for achieving the object, the charge pumping circuit of this invention for performing push and pull operations in accordance with first and second control signals includes a first switch for controlling one of the push and pull operations in accordance with the first control signal; a current mirror circuit constructed from transistors each having a different polarity from a transistor used for constructing the first switch; a second switch for controlling current input to the current mirror circuit in accordance with the second control signal, the second switch being constructed from a transistor having the same characteristic as the transistor used for constructing the first switch; a first MOS capacitor one end of which is connected to an input side of the current mirror circuit; a second MOS capacitor receiving, at one end thereof, a current concerned with the push and pull operations; and a voltage buffer whose input end is connected to the other end of the second MOS capacitor and whose output end is connected to the other end of the first MOS capacitor, and the other of the push and pull operations is performed with an output current of the current mirror circuit.

In this aspect, one of the push operation and the pull operation is controlled by the first switch and the other of the push operation and the pull operation is controlled by the second switch through the current mirror circuit. At this point, the first switch and the second switch are constructed from the transistors having the same characteristic, and hence, the characteristics of switching noise caused in their switching operations are also the same. Accordingly, charges charged and discharged through the push operation and the pull operation include a charge error derived from the switching noise to the same degree, and hence, the charges concerned with the push operation and the pull operation are balanced. Furthermore, since the first and the second MOS capacitors are connected to each other through the voltage buffer, their capacitance values can be made equal to each other by equalizing the voltages on the latter ends thereof, resulting in improving output accuracy.

In a second aspect, the charge pumping circuit of this invention for performing push and pull operations in accordance with first and second control signals includes a first switch for controlling one of the push and pull operations in accordance with the first control signal; a current mirror circuit constructed from transistors each having a different polarity from a transistor used for constructing the first switch; a second switch for constructing the first switch for controlling current input to the current mirror circuit in accordance with the second control signal, the second switch being constructed from a transistor having the same characteristic as the transistor used; a voltage selector for selectively supplying one of a plurality of voltages in accordance with a given signal; a first MOS capacitor one end of which is connected to an input side of the current mirror circuit and the other end of which is connected to the voltage selector; and a second MOS capacitor having the same capacitance value as the first MOS capacitor and receiving a current concerned with the push and pull operations, and the other of the push and pull operations is performed with an output current of the current mirror circuit.

In the second aspect, since an appropriate voltage is selected for the first MOS capacitor by the voltage selector, the capacitance values of the first MOS capacitor and the second MOS capacitor can be made equal to each other by equalizing the voltages on the latter ends thereof, resulting in improving output accuracy.

In a third aspect, the charge pumping circuit of this invention for performing push and pull operations in accordance with first and second control signals includes a first switch for controlling one of the push and pull operations in accordance with the first control signal; a current mirror circuit constructed from transistors each having a different polarity from a transistor used for constructing the first switch; and a second switch for controlling current input to the current mirror circuit in accordance with the second control signal, the second switch being constructed from a transistor having the same characteristics as the transistor used for constructing the first switch, and a ratio between an amplitude of a current supplied to the first switch and an amplitude of a current supplied to the second switch is n:m (wherein n and m are different positive numbers), and the other of the push and pull operations is performed with an output current of the current mirror circuit.

In a fourth aspect, the charge pumping circuit of this invention for performing push and pull operations in accordance with first and second control signals includes n (wherein n is a natural number) first switches for controlling one of the push and pull operations in accordance with the first control signal; a current mirror circuit constructed from transistors each having a different polarity from transistors used for constructing the first switches; and m (wherein m is a natural number different from n) second switches for controlling current input to the current mirror circuit in accordance with the second control signal, each of the second switches being constructed from a transistor having the same characteristic as the transistor used for constructing the first switches, and the other of the push and pull operations is performed with an output current of the current mirror circuit.

In the third or fourth aspect, a ratio in the amplitude between currents concerned with the push operation and the pull operation is set to a desired integer or positive number ratio.

In a fifth aspect, the charge pumping circuit of this invention for performing push and pull operations in accordance with first and second control signals includes a first switch for controlling one of the push and pull operations in accordance with the first control signal; a current mirror circuit constructed from transistors each having a different polarity from a transistor used for constructing the first switch; a second switch for controlling current input to the current mirror circuit in accordance with the second control signal, the second switch being constructed from a transistor having the same characteristic as the transistor used for constructing the first switch; a third switch for performing a switching operation in accordance with an inverted signal of the first control signal, a first end of the third switch being connected to a current source for supplying a current to the first switch and a second end of the third switch being supplied with a given voltage; and a fourth switch for performing a switching operation in accordance with an inverted signal of the second control signal, a first end of the fourth switch being connected to a current source for supplying a current to the second switch and a second end of the fourth switch being supplied with a given voltage, and the other of the push and pull operations is performed with an output current of the current mirror circuit.

In the fifth aspect, charges concerned with the push operation and the pull operation of the charge pumping circuit are highly accurately balanced, so as to realize a faster operation.

Preferably, the second end of the third switch and the second end of the fourth switch are supplied with a common voltage.

According to this invention, the charge charged through the push operation and the charge discharged through the pull operation are balanced or kept in a desired ratio. Moreover, since the switches used for controlling the push operation and the pull operation are constructed from the transistors of the same type, namely, a one-sided switching system is employed, the present charge pumping circuit is operated at a low voltage and the power consumption is reduced.

DETAILED DESCRIPTION OF THE INVENTION

Preferred embodiments of the invention will now be described with reference to the accompanying drawings.

Embodiment 1

Figure 1:
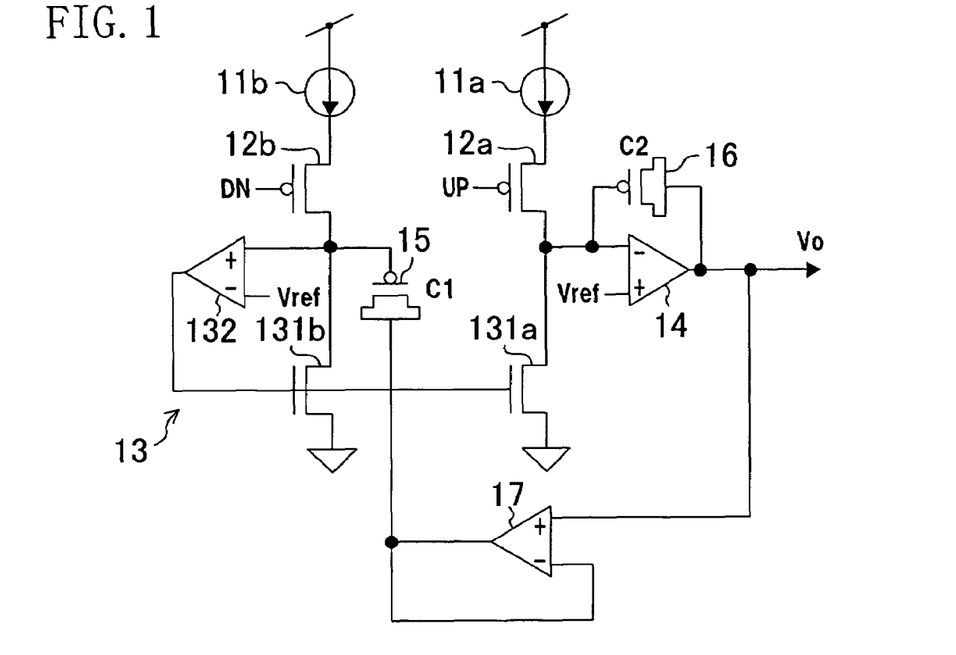
FIG. 1 is a diagram for showing the configuration of a charge pumping circuit according to Embodiment 1 of the invention.

FIG. 1 shows the configuration of a charge pumping circuit according to Embodiment 1. The charge pumping circuit of this embodiment includes current sources 11a and 11b, switches 12a and 12b, a current mirror circuit 13, an operational amplifier 14, capacitors 15 and 16 and a voltage buffer 17. The capacitor 15 is a MOS capacitor, one end of which is connected to the input side of the current mirror circuit 13 and the other end of which is connected to the output end of the voltage buffer 17. Also, the capacitor 16 is a MOS capacitor, one end of which is connected to the inverted input end of the operational amplifier 14 and the other end of which is connected to the output end of the operational amplifier 14 and the input end of the voltage buffer 17.

The switch 12a is constructed from a p-channel transistor controlled in accordance with a signal UP. Specifically, when the signal UP is activated, the switch 12a is turned on so as to supply a current from the current source 11a to the capacitor 16. On the other hand, when the signal UP is deactivated, the switch 12a is turned off so as to stop the current supply operation to the capacitor 16. In other words, the switch 12a controls a current push operation to the capacitor 16.

The switch 12b is similarly constructed from a p-channel transistor controlled in accordance with a signal DN. Specifically, when the signal DN is activated, the switch 12b is turned on so as to input a current supplied from the current source 11b to the current mirror circuit 13. It is noted that the current value of the current source 11b is assumed to be equal to the current value of the current source 11a. On the other hand, when the signal DN is deactivated, the switch 12b is turned off so as to stop the current input to the current mirror circuit 13. In other words, the switch 12b controls the current input to the current mirror circuit 13.

The current mirror circuit 13 includes n-channel transistors 131a and 131b respectively on the output side and the input side, the transistors each having a different polarity from the switches 12a and 12b, and further includes an operational amplifier 132 inserted between the drain and the gate of the transistor 131b. A reference voltage Vref is provided to the inverted input end of the operational amplifier 132 and a voltage on the input side of the current mirror circuit 13 is provided to the non-inverted input end thereof. Also, the gates of the n-channel transistors 131a and 131b are connected to the output end of the operational amplifier 132. The operational amplifier 132 is operated so that the voltage on the input side of the current mirror circuit 13 can be the voltage Vref, and amplifies a differential voltage between the reference voltage Vref and a voltage generated in the capacitor 15 by the current supplied from the current source 11b when the switch 12b is turned on, and provides an output voltage resulting from the amplification to the gates of the n-channel transistors 131a and 131b. The current mirror circuit 13 having this structure draws, as an output current, a current in the same amplitude as the input current to the output side.

The output side of the current mirror circuit 13 is connected to the capacitor 16. The direction of the output current of the current mirror circuit 13 seen from the capacitor 16 is reverse to the direction of the current supplied from the current source 11a by the control of the switch 12a. Specifically, owing to the output current of the current mirror circuit 13, a current pull operation from the capacitor 16 is performed. As described above, since the current input to the current mirror circuit 13 is controlled by the switch 12b, the current pull operation from the capacitor 16 is substantially controlled by the switch 12b.

The non-inverted input end of the operational amplifier 132 is connected to the capacitor 15. The capacitor 15 works as a filter, namely, receives the current supplied from the current source 11b when the switch 12b is turned on for storing charge and discharges the stored charge when the switch 12b is turned off.

The non-inverted input end of the operational amplifier 14 is supplied with the reference voltage Vref, and the operational amplifier 14 is operated so that the voltage on the output side of the current mirror circuit 13 can be the voltage Vref. It is noted that the operational amplifier 14 works as a low-pass filter together with the capacitor 16. Also, the operational amplifier 14 is operated so that the voltage on the output side of the current mirror circuit 13 can be the voltage Vref, and together with the aforementioned operation of the operational amplifier 132, the voltages on the input side and on the output side of the current mirror circuit 13 are equal to each other. Thus, the mirror ratio accuracy of the current mirror circuit 13 is improved, resulting in improving balance of charges concerned with the push operation and the pull operation.

Preferably, the switches 12a and 12b of the charge pumping circuit having the aforementioned configuration are constructed from p-channel transistors having the same transistor size and the same characteristics. Thus, the switching noise characteristics of the switches 12a and 12b are equal to each other. As described above, in the charge pumping circuit of this embodiment, the push operation is controlled by the switch 12a and the pull operation is controlled by the switch 12b. Therefore, when the switching characteristics of the switches 12a and 12b are equal to each other, the charge charged through the push operation and the charge discharged through the pull operation are equal to each other including a charge error derived from switching noise.

More preferably, the capacitance values of the capacitors 15 and 16 are set to be equal to each other. Thus, an anti-power supply noise characteristic against variation of the reference voltage and the ground voltage is improved. Although a MOS capacitor is better in the area efficiency than a MIM capacitor, the dependency on a gate-substrate voltage is large and the capacitance value may be varied depending upon an applied voltage. When the capacitance values of the capacitors 15 and 16 are different, gate leakage currents flowing to the capacitors are also different, and as a result, the balance of the charges concerned with the push operation and the pull operation is degraded. Therefore, as shown in FIG. 1, substrate side terminals of the capacitors 15 and 16 are connected to each other through the voltage buffer 17, and thus, the applied voltages to these capacitors are made substantially the same so as to set the capacitance values of the capacitors 15 and 16 to be equal to each other. Furthermore, since the gate leakage currents of the capacitors 15 and 16 are also equal to each other, the balance of the charges concerned with the push operation and the pull operation is improved. Now, the anti-power supply noise characteristic of the charge pumping circuit of this embodiment will be described by comparison with a conventional charge pumping circuit.

First, response to variation of the reference voltage will be described. In the conventional charge pumping circuit shown in FIG. 6, when the reference voltage Vref is lowered by a voltage $\Delta V$, a part of a charge ($\Delta V C p$) stored in parasitic capacitance (having a capacitance value Cp) parasitic to a node between the switch 101 and the switch 103 moves to the capacitor 16 (having a capacitance value C2), and the output voltage is changed from the voltage Vo to a voltage Vox. In this case, the following relational expression holds on the basis of the conservation of charge:

$$(Vref-Vo)C2+\Delta VCp=(Vref-\Delta V-Vox)C2$$

When this relational expression is expanded, the following solution is obtained:

$$Vox=Vo-\Delta V-\Delta VCp/C2$$

At this point, since the capacitance value C2 of the capacitor 16 is sufficiently larger than the capacitance value Cp of the parasitic capacitance (C2>>Cp), the third term on the right-hand side of the solution can be ignored. As a result, an approximate solution represented by the following expression is obtained:

$$Vox=Vo-\Delta V$$

In this manner, in the conventional charge pumping circuit, the variation of the reference voltage directly leads to variation of the output voltage. In other words, a voltage difference Vo−Vss between the ground voltage Vss and the output voltage Vo is varied in accordance with the variation of the reference voltage. This reveals that the conventional charge pumping circuit is weak in the variation of the reference voltage, namely, noise caused in the reference voltage.

On the other hand, in the charge pumping circuit of this embodiment, when the reference voltage Vref is lowered by a voltage ΔV, a part of a charge (ΔVCp) stored in parasitic capacitance (having a capacitance value Cp) parasitic to a node between the switch 11a and the transistor 131a similarly moves to the capacitor 16 (having a capacitance value C2). Highly importantly, the reference voltage Vref supplied to the operational amplifier 132 is also lowered by the voltage ΔV, and therefore, a part of a charge (ΔVC1) stored in the capacitor 15 (having a capacitance value C1) flows into the ground through the transistor 131b, and in accordance with this charge flow, the transistor 131a draws the same quantity of charge (ΔVC1) from the outside, namely, from the capacitor 16. It is assumed that the output voltage of the charge pumping circuit is changed from the voltage Vo to a voltage Vox as a result. In this case, the following relational expression holds on the basis of the conservation of charge:

$$(Vref-Vo)C2+\Delta VCp-\Delta VC1=(Vref-\Delta V-Vox)C2$$

When this relational expression is expanded, the following solution is obtained:

$$Vox=Vo+\Delta V(C1-C2-Cp)/C2$$

At this point, since the capacitance value C1 of the capacitor 15 and the capacitance value C2 of the capacitor 16 are both sufficiently larger than the capacitance value Cp of the parasitic capacitance (C1>>Cp and C2>>Cp), the second term on the right-hand side of the solution can be ignored. Also, when it is assumed that the capacitance values of the capacitors 15 and 16 are equal to each other (C1=C2), an approximate solution represented by the following expression is obtained:

$$Vox=Vo$$

In this manner, in the charge pumping circuit of this embodiment, when the capacitance values of the capacitors 15 and 16 are set to be equal, the output voltage is not varied even when the reference voltage is varied. In other words, a voltage difference Vo−Vss between the ground voltage Vss and the output voltage Vo is not varied even when the reference voltage is varied. This reveals that the charge pumping circuit of this embodiment is strong in the variation of the reference voltage, namely, noise of the reference voltage.

Next, response to variation of the ground voltage will be described. In the conventional charge pumping circuit of FIG. 6, when the ground voltage Vss is increased by a voltage ΔV, a part of a charge (ΔVCp) stored in parasitic capacitance (having a capacitance value Cp) parasitic to a node between the switch 101 and the switch 103 moves to the capacitor 16 (having a capacitance value C2), and the output voltage is changed from the voltage Vo to a voltage Vox. In this case, the following relational expression holds on the basis of the conservation of charge:

$$(Vref-Vo)C2+\Delta VCp=(Vref-Vox)C2$$

When this relational expression is expanded, the following solution is obtained:

$$Vox=Vo-\Delta VCp/C2$$

At this point, since the capacitance value C2 of the capacitor 16 is sufficiently larger than the capacitance value Cp of the parasitic capacitance (C2>>Cp), the second term on the right-hand side of the solution can be ignored. As a result, an approximate solution represented by the following expression is obtained:

$$Vox=Vo$$

In this manner, in the conventional charge pumping circuit, even when the ground voltage is varied, the output voltage is not varied. In other words, when the ground voltage is varied, a voltage difference Vo−Vss between the ground voltage Vss and the output voltage Vo is varied in accordance with the variation of the ground voltage. This reveals that the conventional charge pumping circuit is weak in the variation of the ground voltage, namely, noise caused in the ground voltage.

On the other hand, in the charge pumping circuit of this embodiment, when the ground voltage Vss is increased by a voltage ΔV, a part of a charge (ΔVCp) stored in parasitic capacitance (having a capacitance value Cp) parasitic to a node between the switch 11a and the transistor 131a similarly moves to the capacitor 16 (having a capacitance value C2). Highly importantly, the ground voltage Vss supplied to the current mirror circuit 13 is also increased by the voltage ΔV, and therefore, a part of a charge (ΔVC1) stored in the capacitor 15 (having a capacitance value C1) flows into the ground through the transistor 131b, and in accordance with this charge flow, the transistor 131a draws the same quantity of charge (ΔVC1) from the outside, namely, from the capacitor 16. It is assumed that the output voltage of the charge pumping circuit is changed from the voltage Vo to a voltage Vox as a result. In this case, the following relational expression holds on the basis of the conservation of charge:

$$(Vref-Vo)C2+\Delta VCp-\Delta VC1=(Vref-Vox)C2$$

When this relational expression is expanded, the following solution is obtained:

$$Vox=Vo+\Delta V(C1-Cp)/C2$$

At this point, since the capacitance value C1 of the capacitor 15 and the capacitance value C2 of the capacitor 16 are both sufficiently larger than the capacitance value Cp of the parasitic capacitance (C1>>Cp and C2>>Cp), the second term on the right-hand side of the solution can be substituted for ΔV. Also, when it is assumed that the capacitance values of the capacitors 15 and 16 are equal to each other (C1=C2), an approximate solution represented by the following expression is obtained:

$$Vox=Vo+\Delta V$$

In this manner, in the charge pumping circuit of this embodiment, when the capacitance values of the capacitors 15 and 16 are set to be equal to each other, the variation of the ground voltage directly leads to variation of the output voltage. In other words, when the ground voltage Vss is varied, the output voltage Vo is also varied in the same quantity, and as a result, a voltage difference Vo−Vss between the ground voltage Vss and the output voltage Vo is kept constant. This reveals that the charge pumping circuit of this embodiment is strong in the variation of the ground voltage, namely, noise of the ground voltage.

In the above description, it is assumed that the capacitance value C1 of the capacitor 15 and the capacitance value C2 of the capacitor 16 are equal to each other (C1=C2), but it is not intended that they are completely equal to each other. When these capacitance values are substantially equal to each other, the effect to improve the anti-noise characteristic is sufficiently exhibited.

As described so far, according to this embodiment, the charge charged through the push operation and the charge discharged through the pull operation are made equal to each other including switching noise such as feedthrough noise and injection noise and a charge error derived from leakage of the switch portion such as GIDL (gate induced drainbarrier lowering), DIBL (drain induced barrier lowering) or gate leakage. In other words, in the charge pumping circuit of this embodiment, these noise and leakage do not particularly harmfully affect the balance of the charges charged and discharged through the push operation and the pull operation, and hence, they are substantially cancelled. Furthermore, the charge pumping circuit of this embodiment is strong in the variation of the reference voltage and the ground voltage and is good at the anti-noise characteristic.

Moreover, in the conventional charge pumping circuit, the two transistors having different channel types serially connected are controlled to be complementarily switched (see FIG. 6), and it is necessary to set comparatively high the supply voltage in consideration of the amplitudes of the control signals for the respective transistors. In contrast, in the charge pumping circuit of this embodiment, since the two transistors controlled to be switched are of the same channel type, the supply voltage can be low. In other words, the charge pumping circuit of this embodiment is operated at a low voltage and the power consumption is comparatively small.

Furthermore, in the charge pumping circuit of this embodiment, since the MOS capacitors are used as the capacitors 15 and 16, the circuit scale is small, and in particular, this charge pumping circuit is effective for process in which a MIM capacitor cannot be used.

In the charge pumping circuit of this embodiment, the balance of the charges concerned with the push operation and the pull operation depends upon the accuracy in the ratio between currents of the current sources 11a and 11b and the accuracy in the mirror ratio of the current mirror circuit 13. However, these accuracies of the ratios can be improved by increasing the transistor size, and therefore, the balance of the charges is comparatively easily secured.

Embodiment 2

Figure 2:
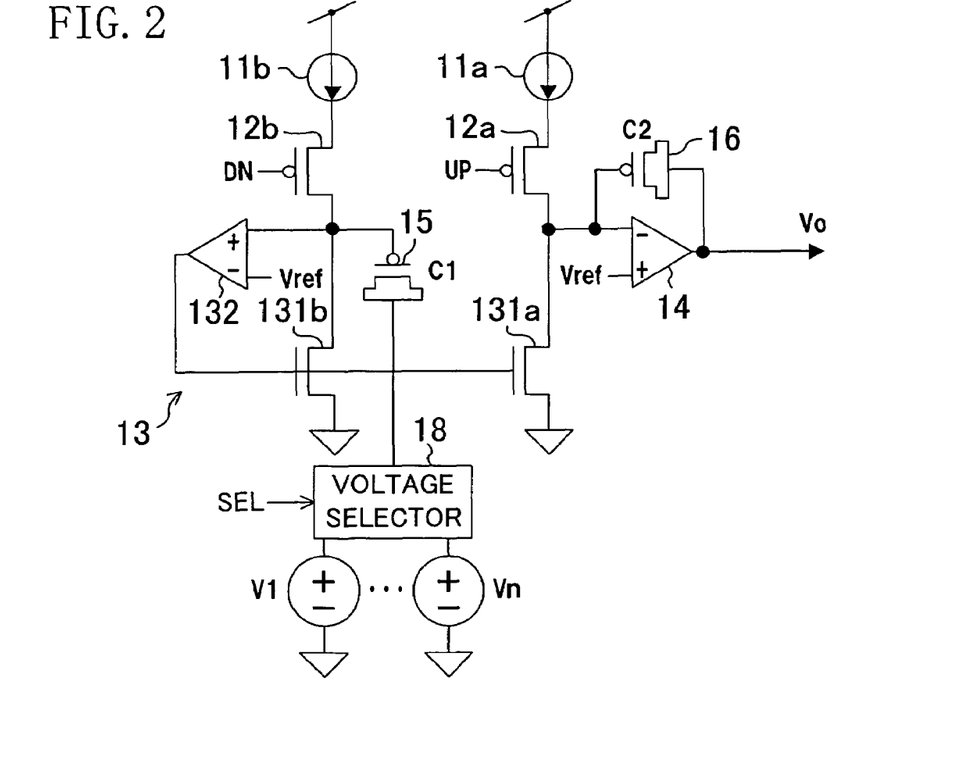
FIG. 2 is a diagram for showing the configuration of a charge pumping circuit according to Embodiment 2 of the invention.

FIG. 2 shows the configuration of a charge pumping circuit of Embodiment 2. In the charge pumping circuit of this embodiment, the voltage buffer 17 of the charge pumping circuit of FIG. 1 is replaced with a voltage selector 18. Herein, differences from Embodiment 1 alone will be described.

A substrate side terminal of a capacitor 15 of a MOS capacitor is connected to the voltage selector 18. The voltage selector 18 selects one of n different voltages V1 through Vn on the basis of a supplied signal SEL and supplies the selected voltage to the substrate side terminal of the capacitor 15. In particularly, when the charge pumping circuit of this embodiment is used in a PLL, a value to be set as an output voltage Vo of the charge pumping circuit is obtained on the basis of a desired output frequency. Therefore, in accordance with switching of the output frequency of the PLL, the output voltage Vo to be set is supplied to the substrate side terminal of the capacitor 15, and thus, capacitance values of the capacitors 15 and 16 can be made equal to each other. Specifically, assuming that the output frequency of the PLL is switched in n stages in accordance with the signal SEL, the voltages V1 through Vn are previously prepared as the output voltages Vo to be set correspondingly to the respective output frequencies, and the voltage selector 18 selects one voltage corresponding to the current output frequency out of the voltages V1 through Vn on the basis of the signal SEL.

As described so far, according to this embodiment, although the MOS capacitors are used as the capacitors 15 and 16, there is no need to provide a voltage buffer for making voltages on their substrate side terminals accord with each other, and therefore, the circuit scale is further smaller. Also, the balance of the charges concerned with the push operation and the pull operation is sufficiently highly kept.

Embodiment 3

In the charge pumping circuit shown in FIG. 1, the output voltage of the current source 11a is close to the supply voltage when the switch 12a is in an off state. When the switch 12a is turned on, the output voltage of the current source 11a, namely, the output voltage of the switch 12a, is gradually converged to a normal value close to the reference voltage Vref. The time thus necessary for converging the output voltage of the switch 12a is a factor to inhibit a fast operation of the charge pumping circuit. Also, the instant that the switch 12a is turned on, overshoot is caused in the output current of the switch 12a, and thus, a noise current is caused. When the operation frequency of the charge pumping circuit is sufficiently low, the noise current derived from the overshoot is not a serious problem, but as the operation frequency is higher, the proportion of the noise current in the whole output current is larger. This is an inhibiting factor in securing the balance of the charges concerned with the push operation and the pull operation. These matters are the same with respect to the current source 11b and the switch 12b.

The convergence time of the output voltage and the overshoot of the output voltage depend upon wiring resistance and parasitic capacitance or the like of the current sources 11a and 11b and the switches 12a and 12b. In particular, the parasitic capacitance is largely varied among elements, and hence, the overshoot caused in the output current of the switch 12a is different in the amplitude from that caused in the output current of the switch 12b, which makes it difficult to accurately secure the balance of the charges concerned with the push operation and the pull operation.

Figure 3:
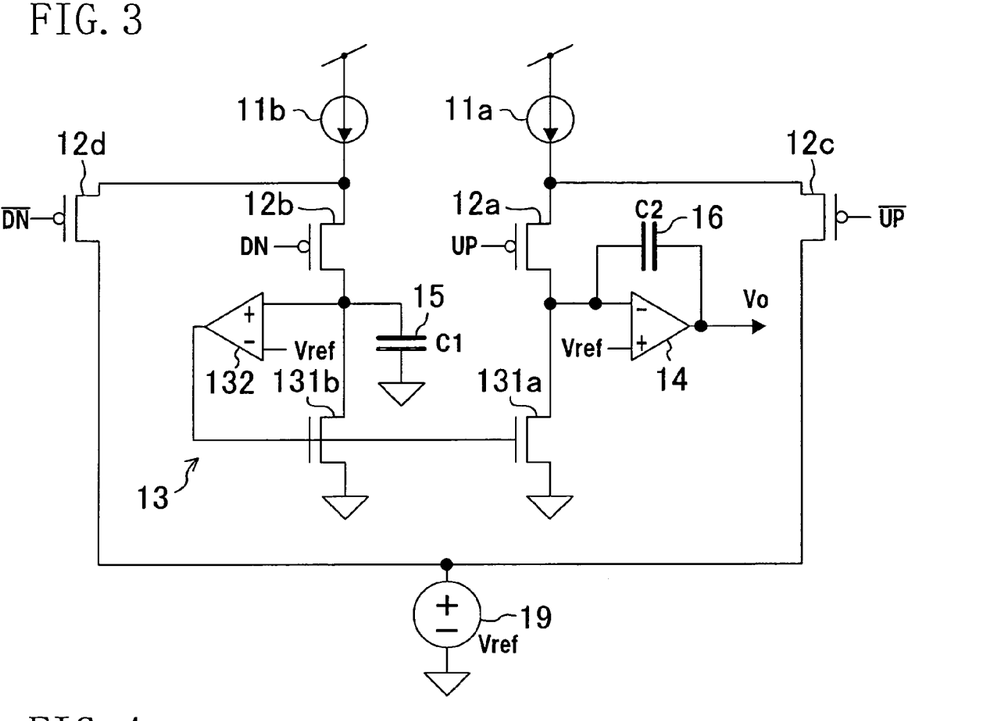
FIG. 3 is a diagram for showing the configuration of a charge pumping circuit according to Embodiment 3 of the invention.

FIG. 3 shows the configuration of a charge pumping circuit according to Embodiment 3. The charge pumping circuit of this embodiment is configured so as to solve the aforementioned problems. Specifically, in the charge pumping circuit of this embodiment, switches 12c and 12d are additionally provided in parallel to the switches 12a and 12b of the charge pumping circuit shown in FIG. 1. In the charge pumping circuit of FIG. 1, when the capacitors 15 and 16 are constructed from a capacitor other than the MOS capacitor, such as a MIM capacitor, there is no need to provide the voltage buffer 17. Therefore, the voltage buffer is omitted in the charge pumping circuit of this embodiment. Herein, differences from Embodiment 1 alone will be described.

The switch 12c is constructed from a p-channel transistor similarly to the switch 12a, one end of which is connected to the output side of a current source 11a and the other end of which is connected to a power source 19. The power source 19 supplies a reference voltage Vref. The switch 12c is controlled in accordance with an inverted signal of a signal UP (i.e., a signal /UP). In other words, the switch 12c and the switch 12a are alternately placed in an on state. Specifically, the switch 12c is turned on when the signal /UP is activated, so as to connect the current source 11a to the power source 19. On the other hand, when the signal /UP is deactivated, the switch 12c is turned off, so as to disconnect the power source 19 from the current source 11a.

The switch 12d is constructed from a p-channel transistor similarly to the switch 12b, one end of which is connected to the output side of a current source 11b and the other end of which is connected to the power source 19. The switch 12d is controlled in accordance with an inverted signal of a signal DN (i.e., a signal /DN). In other words, the switch 12b and the switch 12d are alternately placed in an on state. Specifically, the switch 12d is turned on when the signal /DN is activated, so as to connect the current source 11b to the power source 19. On the other hand, when the signal /DN is deactivated, the switch 12d is turned off, so as to disconnect the power source 19 from the current source 11b.

As described so far, according to this embodiment, the current sources 11a and 11b always supply the currents, and their output voltages are constant in the vicinity of the reference voltage Vref having a constant value. Thus, the output voltages and the output currents of the switches 12a and 12b are rapidly converged to the constant values after they are turned on, and hence, the charge pumping circuit is rapidly operated. Also, since overshoot caused in the output currents of the switches 12a and 12b, which can be a factor to cause a noise current, is reduced, the balance of the charges concerned with the push operation and the pull operation is highly accurately kept in the rapid operation.

Preferably, the switches 12c and 12d are constructed from p-channel transistors having the same transistor size and the same characteristics as those used for the switches 12a and 12b. Thus, the feedthrough noise caused in the switches 12c and 12d can be cancelled with the feedthrough noise caused in the switches 12a and 12b, so as to improve the accuracy of the output currents.

Figure 4:
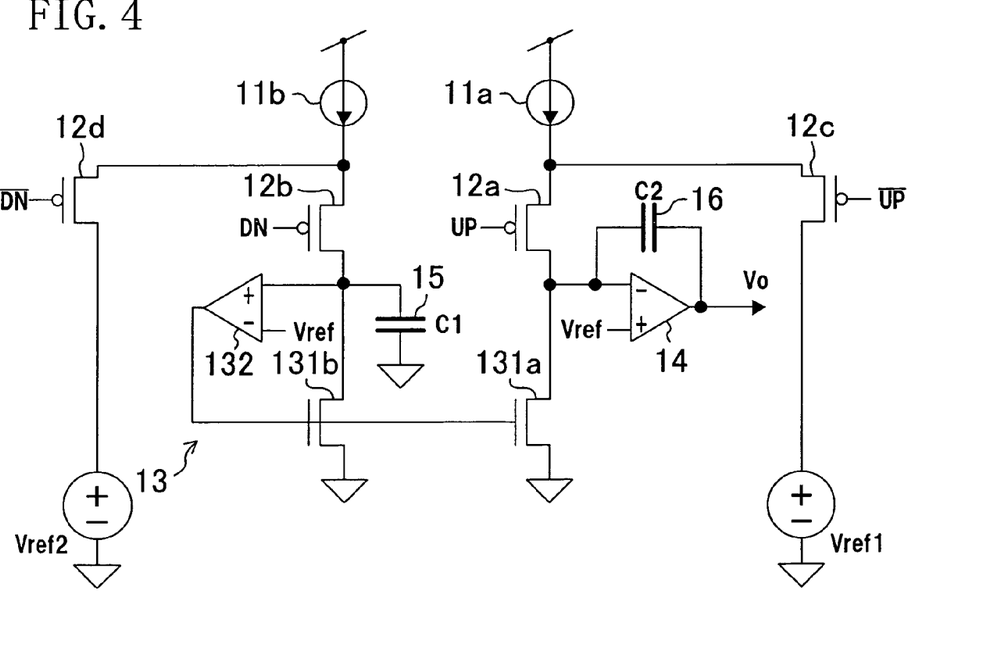
FIG. 4 is a diagram of a modification of the charge pumping circuit of FIG. 3.

In the case where the convergence times of the output voltages of the switches 12c and 12d are not strongly restricted, there is no need to always supply the same voltage to the switches 12c and 12d. In this case, different reference voltages Vref1 and Vref2 may be respectively supplied to the switches 12c and 12d as shown in FIG. 4.

Embodiment 4

In a general charge pumping circuit, the amplitude ratio between currents concerned with the push operation and the pull operation is 1:1, but a ratio of n:m (wherein n and m are different natural numbers) may be required in some applications. For example, a DLL disclosed in Japanese Patent Application No. 2005-264131 (invented by the present inventors) requires a charge pumping circuit for realizing a current ratio of 2:1 or 3:1.

Figure 5:
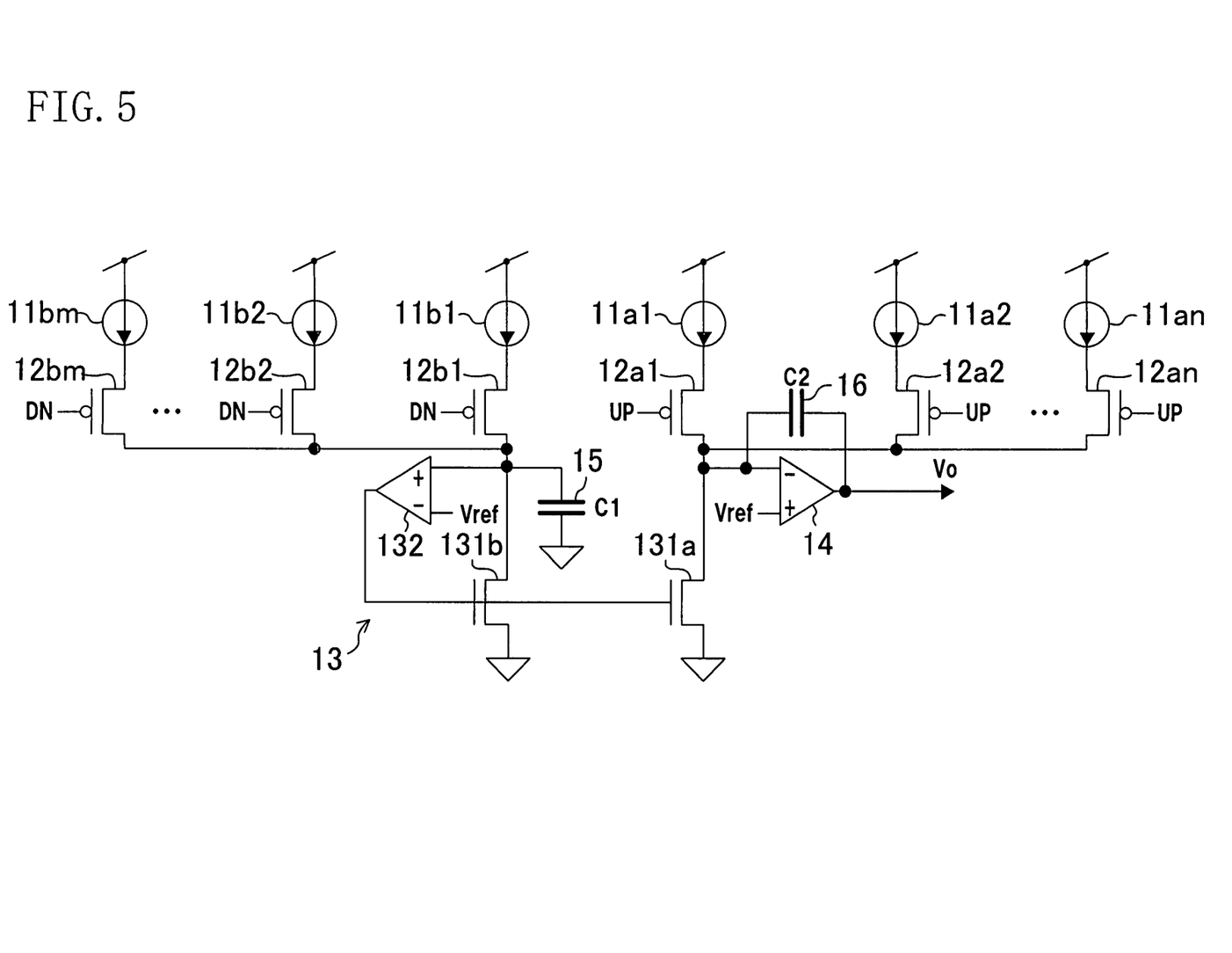
FIG. 5 is a diagram for showing the configuration of a charge pumping circuit according to Embodiment 4 of the invention.

FIG. 5 shows the configuration of a charge pumping circuit according to Embodiment 4. The charge pumping circuit of this embodiment is configured so as to solve the aforementioned problem. Specifically, the charge pumping circuit of this embodiment includes n combinations of the current source 11a and the switch 12a and m combinations of the current source 11b and the switch 12b of the charge pumping circuit shown in FIG. 1. The current sources 11a1 through 11an and 11b1 through 11bm all have the same characteristics. Also, the switches 12a1 through 12an and 12b1 through 12bm all have the same characteristics. In the charge pumping circuit of this embodiment, the voltage buffer 17 used in the charge pumping circuit of FIG. 1 is omitted. Herein, differences from Embodiment 1 alone will be described.

All the switches 12a1 through 12an are turned on when a signal UP is activated, so as to respectively supply currents from the current sources 11a1 through 11an to a capacitor 16. On the other hand, when the signal UP is deactivated, all the switches 12a1 through 12an are turned off, so as to stop the current supply to the capacitor 16. All the switches 12b1 through 12bm are turned on when a signal DN is activated, so as to respectively input currents from the current sources 11b1 through 11bm to a current mirror circuit 13. On the other hand, when the signal DN is deactivated, all the switches 12b1 through 12bm are turned off, so as to stop the current input to the current mirror circuit 13.

In this manner, according to this embodiment, the amplitude ratio between the currents concerned with the push operation and the pull operation is set to n:m. In particular, since the charge pumping circuit includes a plurality of combinations of current sources and switches respectively having the same characteristics, the ratio between the currents concerned with the push operation and the pull operation is accurately set to n:m including switching noise of the respective switches.

It is noted that the current ratio between the current sources 11a and 11b may be set to a desired ratio in the charge pumping circuit shown in FIG. 1. In this case, as compared with the charge pumping circuit shown in FIG. 5, although the accuracy is lower due to ununiformity of the switching noise and an error of the current mirror ratio, the circuit scale is advantageously smaller. Also, the amplitude ratio between the currents concerned with the push operation and the pull operation can be advantageously set to a ratio other than an integer ratio.

In the above description, the switches 12a and 12b or the switches 12c and 12d are constructed from the p-channel transistors, which does not limit the invention. Switches constructed from n-channel transistors may be controlled in their switching operations in accordance with the signals UP and DN. In this case, it goes without saying that the current mirror circuit is constructed from p-channel transistors. Even when the polarities of the transistors used for the switches and the current mirror circuit are changed in this manner, the effects of this invention are not spoiled at all.

In the charge pumping circuit of this invention, the charge charged through the push operation and the charge discharged through the pull operation are well balanced or kept in a desired ratio, and therefore, it is useful as a charge pumping circuit for use in a PLL or a DLL in which such balance is particularly required.

What is claimed is:

1. A charge pumping circuit for performing push and pull operations in accordance with first and second control signals, comprising:
   a first switch for controlling one of the push and pull operations in accordance with said first control signal;
   a current mirror circuit constructed from transistors each having a different polarity from a transistor used for constructing said first switch;

a second switch for controlling current input to said current mirror circuit in accordance with said second control signal, said second switch being constructed from a transistor having the same characteristic as said transistor used for constructing said first switch;

a first MOS capacitor one end of which is connected to an input side of said current mirror circuit;

a second MOS capacitor receiving, at one end thereof, a current concerned with the push and pull operations; and a voltage buffer whose input end is connected to the other end of said second MOS capacitor and whose output end is connected to the other end of said first MOS capacitor, wherein the other of the push and pull operations is performed with an output current of said current mirror circuit.

2. A charge pumping circuit for performing push and pull operations in accordance with first and second control signals, comprising:

a first switch for controlling one of the push and pull operations in accordance with said first control signal;

a current mirror circuit constructed from transistors each having a different polarity from a transistor used for constructing said first switch;

a second switch for controlling current input to said current mirror circuit in accordance with said second control signal, said second switch being constructed from a transistor having the same characteristic as said transistor used for constructing said first switch;

a voltage selector for selectively supplying one of a plurality of voltages in accordance with a given signal;

a first MOS capacitor one end of which is connected to an input side of said current mirror circuit and the other end of which is connected to said voltage selector; and a second MOS capacitor having the same capacitance value as said first MOS capacitor and receiving a current concerned with the push and pull operations, wherein the other of the push and pull operations is performed with an output current of said current mirror circuit.

3. A charge pumping circuit for performing push and pull operations in accordance with first and second control signals, comprising:

a first switch for controlling one of the push and pull operations in accordance with said first control signal;

a current mirror circuit constructed from transistors each having a different polarity from a transistor used for constructing said first switch; and a second switch for controlling current input to said current mirror circuit in accordance with said second control signal, said second switch being constructed from a transistor having the same characteristics as said transistor used for constructing said first switch, wherein a ratio between an amplitude of a current supplied to said first switch and an amplitude of a current supplied to said second switch is n:m (wherein n and m are different positive numbers), and the other of the push and pull operations is performed with an output current of said current mirror circuit.

4. A charge pumping circuit for performing push and pull operations in accordance with first and second control signals, comprising:

n (wherein n is a natural number) first switches for controlling one of the push and pull operations in accordance with said first control signal;

a current mirror circuit constructed from transistors each having a different polarity from transistors used for constructing said first switches; and m (wherein m is a natural number different from n) second switches for controlling current input to said current mirror circuit in accordance with said second control signal, each of said second switches being constructed from a transistor having the same characteristic as said transistors used for constructing said first switches, wherein the other of the push and pull operations is performed with an output current of said current mirror circuit.

* * * * *